US012580572B2

(12) United States Patent
Kim et al.

(10) Patent No.: US 12,580,572 B2
(45) Date of Patent: Mar. 17, 2026

(54) CMOS-TO-CML CONVERTER, SEMICONDUCTOR DEVICE INCLUDING THE SAME, AND ELECTRONIC DEVICE

(71) Applicant: SAMSUNG ELECTRONICS CO., LTD., Suwon-si (KR)

(72) Inventors: Yongwoo Kim, Suwon-si (KR); Kyeongjoon Ko, Suwon-si (KR); Hurham Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 52 days.

(21) Appl. No.: 18/778,139

(22) Filed: Jul. 19, 2024

(65) Prior Publication Data

US 2025/0030424 A1 Jan. 23, 2025

(30) Foreign Application Priority Data

Jul. 19, 2023 (KR) ........................ 10-2023-0094018

(51) Int. Cl.
*H03K 19/0948* (2006.01)
*H03K 19/0185* (2006.01)

(52) U.S. Cl.
CPC . *H03K 19/0948* (2013.01); *H03K 19/018528* (2013.01)

(58) Field of Classification Search
CPC ............. H03K 19/094; H03K 19/0944; H03K 19/09432; H03K 19/09436; H03K 19/0948
See application file for complete search history.

(56) References Cited

U.S. PATENT DOCUMENTS

| | | | |
|---|---|---|---|
| 6,774,721 B1 * | 8/2004 | Popescu ................. | H03K 5/003 |
| | | | 330/253 |
| 7,034,606 B2 * | 4/2006 | Caresosa ................ | H03G 1/007 |
| | | | 327/563 |
| 7,038,495 B2 | 5/2006 | Choi | |
| 7,215,156 B1 * | 5/2007 | Li ........................ | H04L 25/0282 |
| | | | 326/115 |
| 7,521,976 B1 | 4/2009 | Sudjian et al. | |
| 7,768,348 B2 * | 8/2010 | Banba ..................... | H03F 3/195 |
| | | | 333/32 |
| 7,847,591 B2 | 12/2010 | Yu et al. | |
| 7,936,186 B1 * | 5/2011 | Tong .................. | H03K 19/0948 |
| | | | 326/127 |

(Continued)

FOREIGN PATENT DOCUMENTS

CN 114362511 A 4/2022

OTHER PUBLICATIONS

Communication dated Dec. 16, 2024, issued by European Patent Office in European Patent Application No. 24188623.3.

*Primary Examiner* — Jason M Crawford
(74) *Attorney, Agent, or Firm* — Sughrue Mion, PLLC

(57) ABSTRACT

A complementary metal oxide semiconductor (CMOS)-to-current mode logic (CML) converter for converting a CMOS input signal into a CML output signal, including: a low-pass filter comprising a fixed resistor and a first fixed capacitor, and a swing width control circuit configured to adjust a swing width of a voltage swing of the CML output signal based on a common mode level, wherein the swing width control circuit includes: a second fixed capacitor; and a variable capacitor comprising a capacitor array.

20 Claims, 14 Drawing Sheets

11B

(56) References Cited

U.S. PATENT DOCUMENTS

| | | | | |
|---|---|---|---|---|
| 7,965,120 | B2 * | 6/2011 | Lewison | H03K 5/133 |
| | | | | 327/280 |
| 9,106,193 | B2 * | 8/2015 | Fujii | H03F 3/45197 |
| 9,608,611 | B1 * | 3/2017 | Hearne | H03K 5/135 |
| 9,800,249 | B2 | 10/2017 | Rajavi et al. | |
| 9,876,489 | B1 * | 1/2018 | Casey | H03K 5/05 |
| 11,606,187 | B2 * | 3/2023 | Kubo | H03L 7/113 |
| 2008/0001633 | A1 * | 1/2008 | Narathong | H03K 19/01721 |
| | | | | 326/87 |
| 2008/0024172 | A1 * | 1/2008 | Yu | H03F 3/45183 |
| | | | | 326/115 |
| 2008/0061837 | A1 * | 3/2008 | Xu | H03K 19/018528 |
| | | | | 326/127 |
| 2009/0085645 | A1 * | 4/2009 | Tanaka | H04B 1/16 |
| | | | | 327/407 |
| 2010/0134145 | A1 * | 6/2010 | Bernard | H03K 19/09436 |
| | | | | 326/63 |
| 2010/0244899 | A1 | 9/2010 | Hoque et al. | |
| 2019/0056760 | A1 * | 2/2019 | Zhang | H03K 5/1506 |
| 2020/0313638 | A1 * | 10/2020 | Hong | H03F 3/45183 |
| 2023/0114988 | A1 * | 4/2023 | Kim | H03L 7/0814 |
| | | | | 375/354 |
| 2023/0143218 | A1 * | 5/2023 | Han | H03K 19/00 |
| | | | | 326/83 |
| 2024/0364334 | A1 * | 10/2024 | Jeon | H03K 19/09432 |
| 2025/0030424 | A1 * | 1/2025 | Kim | H03K 19/018528 |
| 2025/0167791 | A1 * | 5/2025 | Hu | H03L 7/091 |

* cited by examiner

Figure 12:
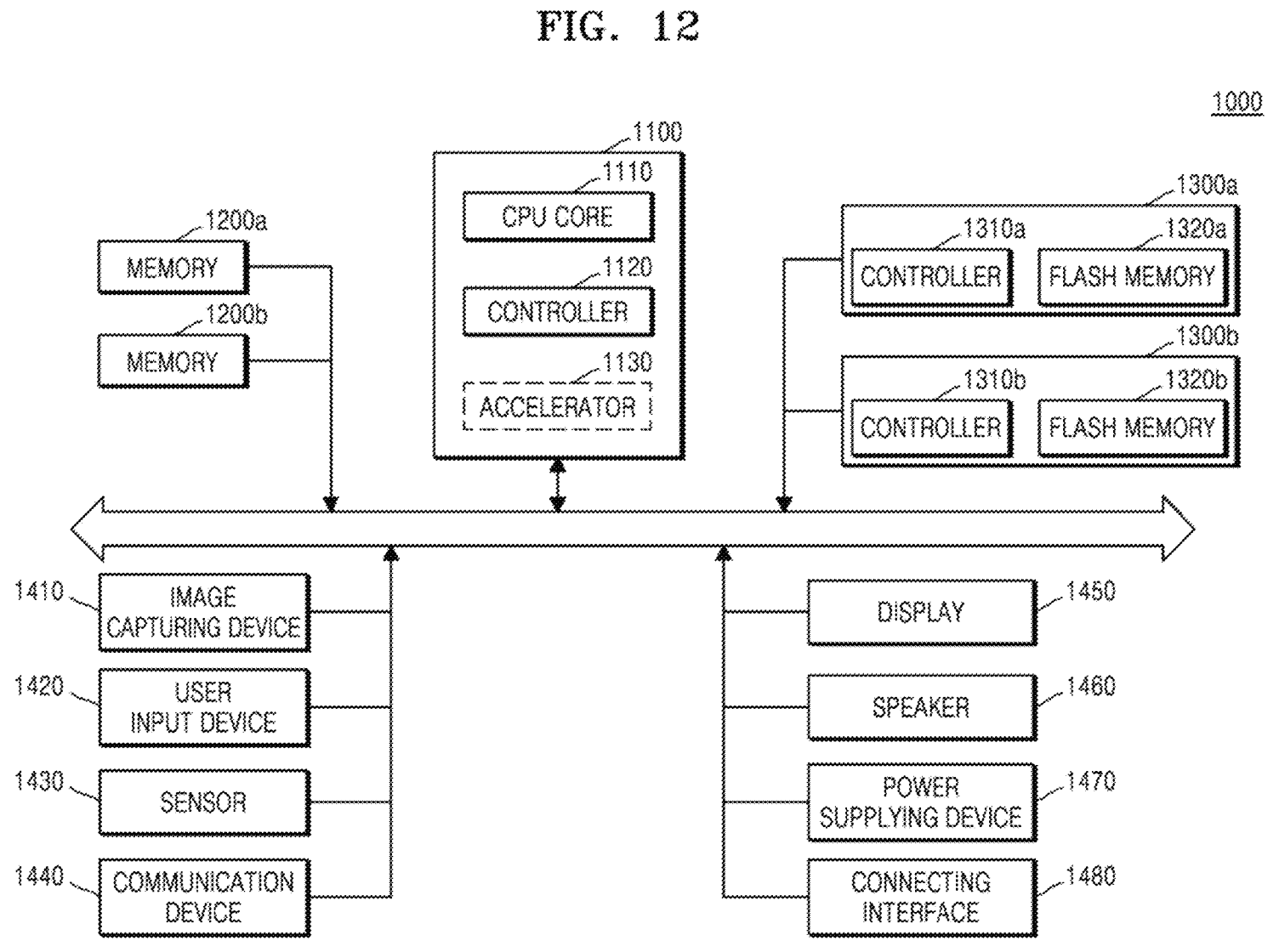

1100
- 1110 CPU CORE
- 1120 CONTROLLER
- 1130 ACCELERATOR

1200a MEMORY
1200b MEMORY

1300a
- 1310a CONTROLLER
- 1320a FLASH MEMORY

1300b
- 1310b CONTROLLER
- 1320b FLASH MEMORY

1410 IMAGE CAPTURING DEVICE
1420 USER INPUT DEVICE
1430 SENSOR
1440 COMMUNICATION DEVICE

1450 DISPLAY
1460 SPEAKER
1470 POWER SUPPLYING DEVICE
1480 CONNECTING INTERFACE

CMOS-TO-CML CONVERTER, SEMICONDUCTOR DEVICE INCLUDING THE SAME, AND ELECTRONIC DEVICE

CROSS-REFERENCE TO RELATED APPLICATION

This application is based on and claims priority under 35 U.S.C. § 119 to Korean Patent Application No. 10-2023-0094018, filed on Jul. 19, 2023, in the Korean Intellectual Property Office, the disclosure of which is incorporated by reference herein in its entirety.

BACKGROUND

1. Field

The disclosure relates to a semiconductor device, and more particularly, to a complementary metal oxide semiconductor (CMOS)-to-current mode logic (CML) converter, a semiconductor device including the same, and an electronic device.

2. Description of Related Art

In data transmission systems, the integration levels of semiconductor devices are increasing and their sizes are becoming smaller. Therefore, when designing semiconductor devices, various aspects of the semiconductor devices may be considered, such as operation speed, power consumption, and noise. The characteristics of a CMOS signal and a CML signal may be different from each other. Therefore, when designing a semiconductor device and an electronic device including the same, it may be beneficial to combine a CMOS signal domain circuit and a CML signal domain circuit to compensate for their shortcomings.

SUMMARY

Provided is a complementary metal oxide semiconductor (CMOS)-to-current mode logic (CML) converter capable of adjusting a swing width of a CML signal without changing waveform characteristics of the signal, a semiconductor device including the same, and an electronic device.

Additional aspects will be set forth in part in the description which follows and, in part, will be apparent from the description, or may be learned by practice of the presented embodiments.

In accordance with an aspect of the disclosure, a complementary metal oxide semiconductor (CMOS)-to-current mode logic (CML) converter for converting a CMOS input signal into a CML output signal, includes: a low-pass filter comprising a fixed resistor and a first fixed capacitor; and a swing width control circuit configured to adjust a swing width of a voltage swing of the CML output signal based on a common mode level, wherein the swing width control circuit includes: a second fixed capacitor; and a variable capacitor comprising a capacitor array.

In accordance with an aspect of the disclosure, a semiconductor device includes: a complementary metal oxide semiconductor (CMOS)-to-current mode logic (CML) converter for converting a CMOS input signal into a CML output signal, wherein the CMOS-to-CML converter includes: a low-pass filter configured to generate an internal signal by attenuating components of the CMOS input signal; and a swing width control circuit configured to generate the CML output signal by adjusting a swing width of a voltage swing of the internal signal, and wherein the swing width control circuit includes: a fixed capacitor; and a variable capacitor comprising a capacitor array.

In accordance with an aspect of the disclosure, an electronic device includes: a complementary metal oxide semiconductor (CMOS) signal domain circuit configured to operate based on a CMOS signal; and a semiconductor device comprising: a current mode logic (CML) signal domain circuit configured to operate using a CML signal, and a CMOS-to-CML converter configured to convert a CMOS input signal into a CML output signal, wherein the CMOS-to-CML converter includes: a low-pass filter comprising a fixed resistor and a first fixed capacitor; and a swing width control circuit, and wherein the swing width control circuit includes: a second fixed capacitor, and a variable capacitor comprising a capacitor array.

BRIEF DESCRIPTION OF DRAWINGS

The above and other aspects, features, and advantages of certain embodiments of the present disclosure will be more apparent from the following detailed description taken in conjunction with the accompanying drawings in which:

FIG. 12 is a diagram illustrating a system to which the semiconductor device according to an embodiment may be applied.

DETAILED DESCRIPTION OF EMBODIMENTS

Figure 1:
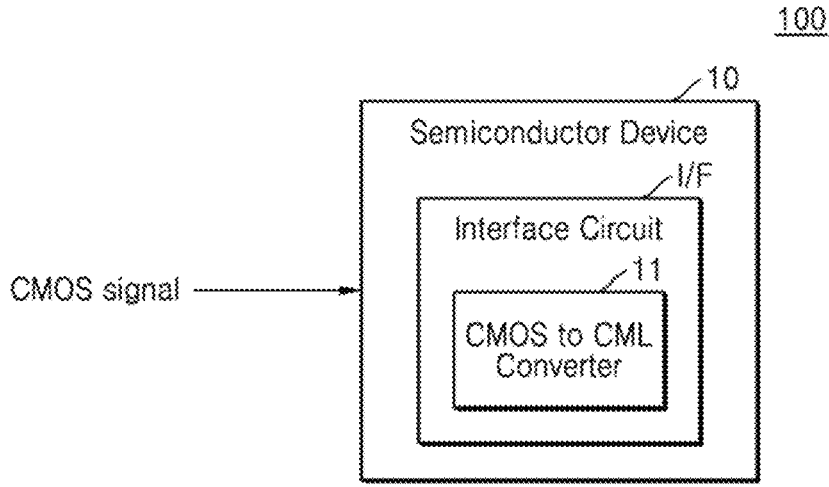
FIG. 1 is a block diagram for illustrating an electronic device including a semiconductor device according to an embodiment.

Hereinafter, various embodiments are described with reference to the accompanying drawings.

As is traditional in the field, the embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the present scope. Further, the blocks, units and/or modules of the embodiments may be physically combined into more complex blocks, units and/or modules without departing from the present scope.

Figure 2:
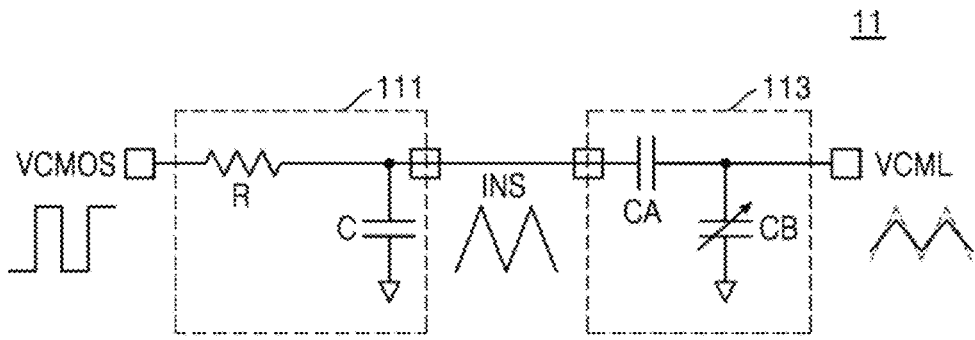
FIG. 2 is a circuit diagram of a complementary metal oxide semiconductor (CMOS)-to-current mode logic (CML) converter in the semiconductor device according to an embodiment.

FIG. 1 is a block diagram for illustrating an electronic device 100 including a semiconductor device 10 according to an embodiment. FIG. 2 is a circuit diagram of a complementary metal oxide semiconductor (CMOS)-to-current mode logic (CML) converter 11 in the semiconductor device 10 according to an embodiment.

Referring to FIG. 1, the electronic device 100 may include a smart phone, a smart watch, a personal digital assistant, a digital video camera, a digital still camera, a network system, a computer, a monitor, a tablet personal computer (PC), a laptop, a netbook, a television, a video game, an automotive device, or the like. However, embodiments are not limited thereto, and the electronic device 100 may include any other electronic equipment that may process data.

The electronic device 100 may include the semiconductor device 10. The semiconductor device 10 may be included in the electronic device 100 and may receive a CMOS signal from a device external to the semiconductor device 10. Also, the semiconductor device 10 may receive a CMOS signal from a circuit external to the electronic device 100. For example, the semiconductor device 10 may receive a CMOS signal from a processor. For example, the processor may include processing units, such as a central processing unit (CPU), a digital signal processor (DSP), a graphics processing unit (GPU), an encryption processing unit, and a physical processing unit, and a machine learning processing unit.

The semiconductor device 10 may include an interface circuit I/F for communication with an external device, and the interface circuit I/F may include the CMOS-to-CML converter 11 that converts a CMOS signal into a CML signal. The CML signal may refer to a signal used in a CML signal domain circuit inside the semiconductor device 10. Depending on the characteristics of the CML signal domain circuit included in the semiconductor device 10, the desired characteristics of the CML signal may vary. In some embodiments, the CMOS-to-CML converter 11 may not be included in the interface circuit I/F. For example, the CMOS-to-CML converter 11 may be an internal component of the semiconductor device 10 rather than the interface circuit I/F.

Here, the CMOS signal may include a signal that swings between a power supply voltage and a ground voltage, and the CML signal may include a signal that swings with a specific swing width based on a determined CML reference level (which may be referred to as a common mode level). For example, the swing width of the CML signal may refer to a difference between a highest voltage of the CML signal and a lowest voltage of the CML signal. The swing width of the CML signal may be designed to be less than that of CMOS signal, and the CML signal may operate as a high-frequency clock signal capable of high-speed switching.

Referring to FIGS. 1 and 2, the CMOS-to-CML converter 11 may receive and convert a CMOS input signal VCMOS and output a CML output signal VCML. The CMOS-to-CML converter 11 may include a low-pass filter 111 and a swing width control circuit 113.

The low-pass filter 111 may include an RC filter including a resistor R and a capacitor C. Here, the resistor R may include a fixed resistor, and the capacitor C may include a fixed capacitor. Accordingly, the resistance of the resistor R and the capacitance of the capacitor C may be constant.

Because a cutoff frequency of the low-pass filter 111 may be determined according to the resistance of the resistor R and the capacitance of the capacitor C, the cutoff frequency of the low-pass filter 111 may not change and may have a constant value $$\left(\frac{1}{2\pi RC}\right).$$

The low-pass filter 111 may generate an internal signal INS by attenuating a signal of a frequency higher than the cutoff frequency from the CMOS input signal VCMOS, and this internal signal INS may include the CML signal. For example, the CMOS input signal VCMOS may have a constant frequency (e.g., fin of FIG. 3B) and may have a square wave shape that toggles between the power supply voltage and the ground voltage. For example, the internal signal INS may have a triangle wave shape with a constant frequency fin and a constant swing width.

The swing width control circuit 113 may receive the internal signal INS and adjust the swing width of the internal signal INS to generate the CML output signal VCML. The swing width control circuit 113 may include a fixed capacitor CA and a variable capacitor CB. The swing width SWF of the CML output signal VCML may be calculated according to Equation 1 below. Here, SWF may denote the swing width of the CML output signal VCML, and SWP may denote the swing width of the internal signal INS.

$$SWF = SWP \times \frac{CA}{CA + CB} \qquad \text{(Equation 1)}$$

The swing width control circuit 113 may generate the CML output signal VCML by adjusting the swing width of the internal signal INS while maintaining the shape of the internal signal INS. Accordingly, the CML output signal VCML may have a triangle wave shape with a constant frequency fin and a constant swing width.

Therefore, the semiconductor device 10 may adjust the swing width SWF of the CML output signal VCML by adjusting the capacitance of the variable capacitor CB. In an embodiment, the capacitance of the variable capacitor CB may be set to a predetermined value according to the specifications of the semiconductor device 10. Also, in an embodiment, the capacitance of the variable capacitor CB within the semiconductor device 10 may be adjusted by the semiconductor device 10, or any of the elements included therein, according to the operation results of the internal circuit of the semiconductor device 10 that operates using the CML output signal VCML. Also, in an embodiment, the capacitance of the variable capacitor CB may be adjusted by a command from an outside of the semiconductor device 10, according to the operation results of the internal circuit of the semiconductor device 10 that operates using the CML output signal VCML.

According to embodiments, the semiconductor device 10 and the electronic device 100 including the semiconductor device 10 may include the CMOS-to-CML converter 11 including the low-pass filter 111 and the swing width control circuit 113. Accordingly, a CMOS-to-CML conversion operation that removes the high frequency harmonic component of the CMOS input signal VCMOS may be performed by the low-pass filter 111. In addition, the swing width of the CML output signal VCML may be adjusted by the swing width control circuit 113 without changing the waveform characteristics of the signal. Accordingly, the CMOS-to-CML converter 11 may generate the CML output signal VCML in a shape which is relatively close to a sinusoidal wave.

Figure 3A:
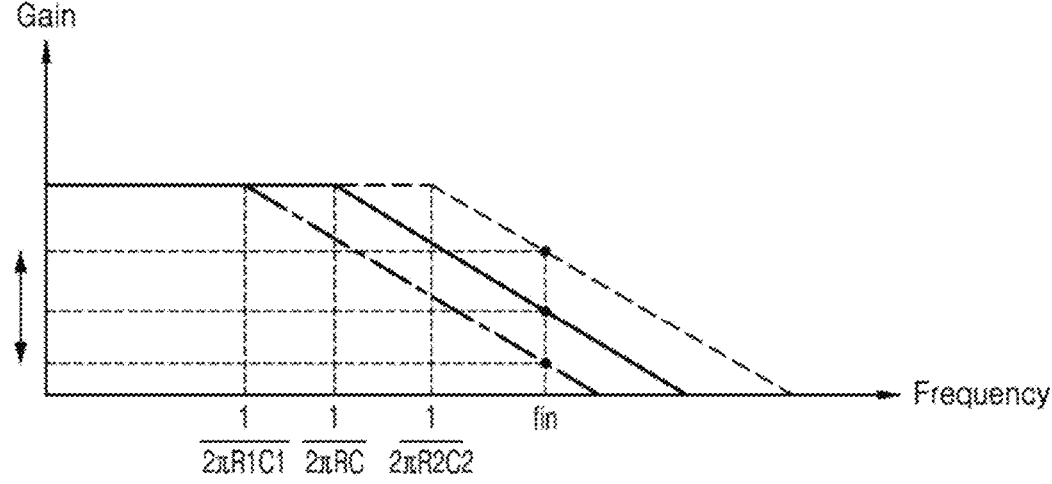
FIG. 3A is a graph for explaining operation of a CMOS-to-CML converter according to a comparative example, according to an embodiment.
Figure 3A:
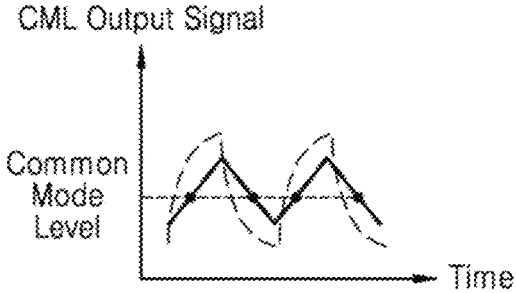
Figure 3B:
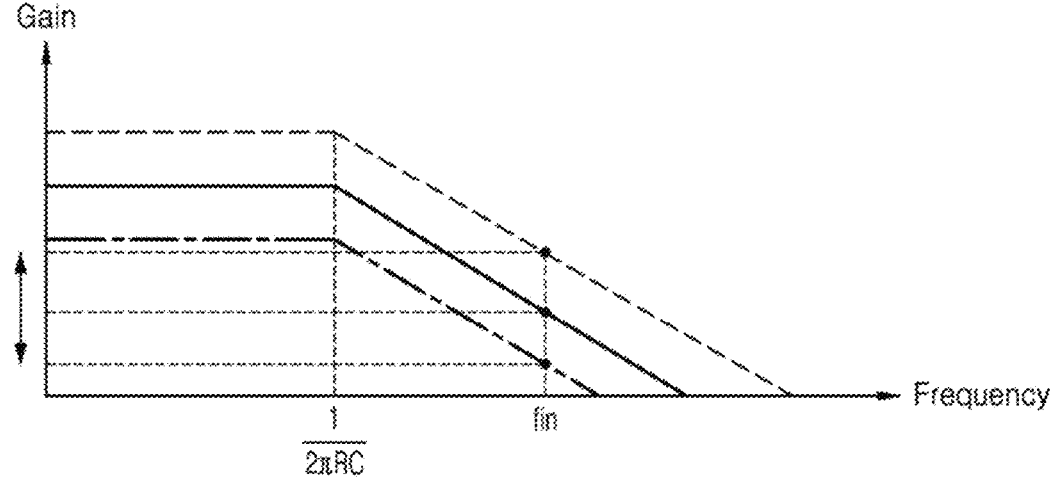
FIG. 3B is a graph for explaining operation of the CMOS-to-CML converter according to an embodiment.
Figure 3B:
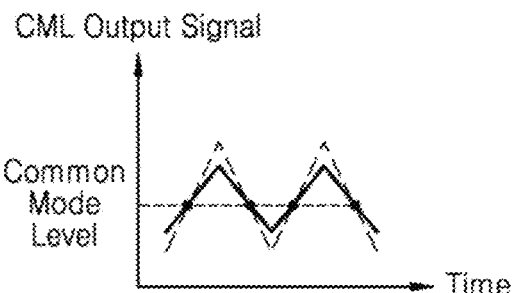

FIG. 3A is a graph for explaining operation of a CMOS-to-CML converter according to a comparative example. FIG. 3B is a graph for explaining operation of the CMOS-to-CML converter 11 according to an embodiment.

Referring to FIG. 3A, the CMOS-to-CML converter according to the comparative example may include a low-pass filter which may be an RC filter including a variable resistor and a variable capacitor. The CMOS-to-CML converter according to the comparative example may remove harmonic components having a high frequency during the CMOS-to-CML conversion process. However, in order to adjust the swing width (or the slew rate) of the CML output signal of the CMOS-to-CML converter, the resistance of the variable resistor or the capacitance of the variable capacitor may be adjusted. For example, if the resistance of the variable resistor is R and the capacitance of the variable capacitor is C (corresponding to the solid line in FIG. 3A), the swing width may be reduced by changing the resistance of the variable resistor to R1 and the capacitance of the variable capacitor to C1 (corresponding to the dashed-dotted line in FIG. 3A). Also, the swing width may be increased by changing the resistance of the variable resistor to R2 and the capacitance of the variable capacitance to C2 (corresponding to the dashed line in FIG. 3A).

However, when the resistance of the variable resistor or the capacitance of the variable capacitor is adjusted to control the swing width of the CML output signal of the CMOS-to-CML converter in the comparative example, in addition to the swing width of the CML output signal being changed, the cutoff frequency of the RC filter may also be changed. Therefore, the bandwidth of the RC filter may also change, and the harmonic characteristics may also change. In other words, the high-frequency component of the CML output signal may change. For example, in the case in which the resistance of the variable resistor is R and the capacitance of the variable capacitor is C (corresponding to the solid line in FIG. 3A), when the resistance of the variable resistor and the capacitance of the variable capacitor are changed to R2 and C2, respectively (corresponding to the dashed line in FIG. 3A), the cutoff frequency may have a value of $$\frac{1}{2\pi R2C2},$$

and the phase of the CML output signal may change, causing the waveform to change from a triangle wave. In addition, the time point at which the CML output signal reaches a common mode level may vary. Here, the common mode level may refer to the midpoint of the peak-to-peak of the CML output signal. In a semiconductor device including the CMOS-to-CML converter according to the comparative example, the internal circuit using the CML output signal may operate according to the common mode level of the CML output signal, and thus, it may be difficult to optimize the CML output signal.

In contrast, referring to FIGS. 2 and 3B, the CMOS-to-CML converter 11 according to embodiments of the present disclosure may independently include the low-pass filter 111 that removes high frequency harmonic components of the CMOS input signal VCMOS and the swing width control circuit 113 that adjusts the swing width of the CML output signal VCML. Therefore, the cutoff frequency of the low-pass filter 111 may have a constant value of $$\frac{1}{2\pi RC}.$$

Therefore, the time point at which the CML output signal VCML reaches the common mode level may be kept constant without changing the shape or phase of the CML output signal VCML. Also, the magnitude of the CML output signal VCML may be changed by only adjusting the capacitance of the variable capacitor CB of the swing width control circuit 113.

For example, in the CMOS-to-CML converter according to the comparative example, the swing width of the CML output signal varies depending on the gain value change in the bandwidth of the RC filter and the signal frequency fin of the CMOS input signal. However, in the CMOS-to-CML converter 11 according to embodiments of the present disclosure, the swing width of the CML output signal VCML is changed only by the capacitance ratio of the fixed capacitor CA and the variable capacitor CB of the swing width control circuit 113. Therefore, a user may obtain the accurate magnitude of the CML output signal VCML at desired step intervals.

Figure 4:
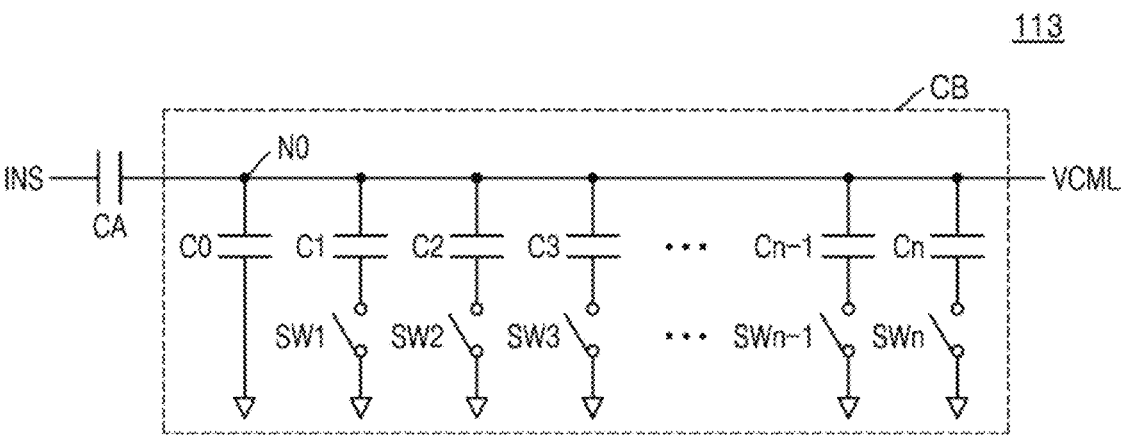
FIG. 4 is a circuit diagram of a swing width control circuit in the CMOS-to-CML converter according to an embodiment.

FIG. 4 is a circuit diagram of the swing width control circuit 113 in the CMOS-to-CML converter 11 according to an embodiment.

Referring to FIG. 4, the swing width control circuit 113 may receive the internal signal INS and adjust the swing width of the internal signal INS to generate the CML output signal VCML. The swing width control circuit 113 may include a fixed capacitor CA and a variable capacitor CB. Here, the variable capacitor CB may include a plurality of capacitors included in a capacitor array, for example first to n-th capacitors C0 to Cn (where n is a natural number), and a plurality of switches, for example first to n-th switches SW1 to SWn.

In an embodiment, a first end of each of the first to n-th capacitors C1 to Cn may be connected to an output node NO, and a second end of each of the first to n-th capacitors C1 to Cn may be connected to a corresponding switch among the first to n-th switches SW1 to SWn. Each of the first to n-th switches SW1 to SWn may connect the second end of a corresponding capacitor among the first to n-th capacitors C1 to Cn to the ground voltage.

Based on the on/off state of the first to n-th switches SW1 to SWn, each of the first to n-th capacitors C1 to Cn may be connected between the output node NO and the ground voltage and may be connected in parallel to a connection capacitor C0. The magnitude of the CML output signal VCML may be controlled by an n-bit switching control signal for controlling each of the first to n-th switches SW1 to SWn.

In an embodiment, each of the first to n-th capacitors C1 to Cn may have the same capacitance. Also, in an embodiment, the capacitances of one or more of the first to n-th capacitors C1 to Cn may be different from each other. The capacitance of the first to n-th capacitors C1 to Cn may be freely modified.

In an embodiment, when the connection capacitor C0 has a reference capacitance CR, the first to n-th capacitors C1 to Cn may have values of CR, 2CR, 4CR, . . . , $2^{n-1} \times CR$, respectively. For example, the first to n-th capacitors C1 to Cn may have a capacitance that is sequentially increased by two times (e.g., a capacitance that is sequentially doubled). For example, the first to n-th capacitors may have capacitances which correspond to a geometric sequence with a common ratio of two.

As the first switch SW1 to the n-th switch SWn sequentially changes from an off-state to an on-state, a signal attenuation ratio, which may refer to a ratio of the swing width of the CML output signal VCML to the swing width of the internal signal INS, may be reduced. For example, based on lower bits of the n-bit switching control signal being sequentially input from the first switch SW1 to the n-th switch SWn, when switching control signals are 00 . . . 000, 00 . . . 001, 00 . . . 010, 00 . . . 011, . . . , 11 . . . 111, the signal attenuation ratios may have values of $$\frac{CA}{CA + CR}, \frac{CA}{CA + (2 \times CR)}, \frac{CA}{CA + (3 \times CR)},$$
$$\frac{CA}{CA + (4 \times CR)}, \dots, \frac{CA}{CA + (2^n \times CR)},$$

respectively.

In an embodiment, the on/off states of the first to n-th switches SW1 to SWn may be determined in advance according to the specifications of the semiconductor device 10. For example, based on the characteristics of a circuit that operates using the CML output signal VCML, the on/off states of the first to n-th switches SW1 to SWn may be determined in advance. Also, in an embodiment, based on the results of operation of the circuit that operates using the CML output signal VCML, the switching control signal may be generated in the semiconductor device 10 in order to adjust the on/off states of the first to n-th switches SW1 to SWn. Also, in an embodiment, based on the results of operation of the circuit that operates using the CML output signal VCML, the on/off states of the first to n-th switches SW1 to SWn may be adjusted by commands from the outside of the semiconductor device 10.

Figure 5:
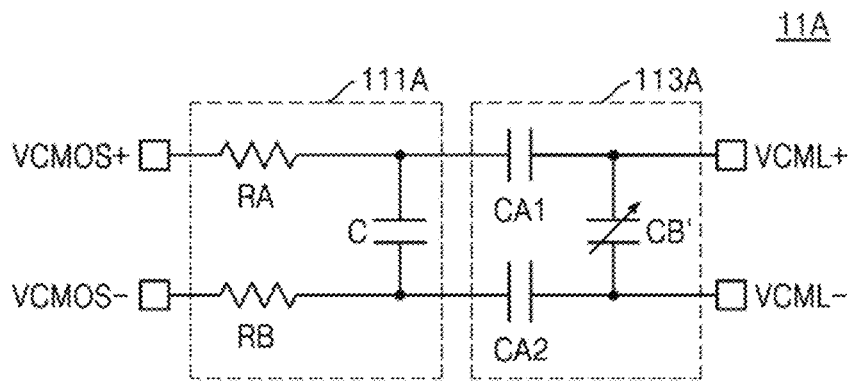
FIG. 5 is a circuit diagram of a CMOS-to-CML converter in a semiconductor device according to an embodiment.
Figure 6:
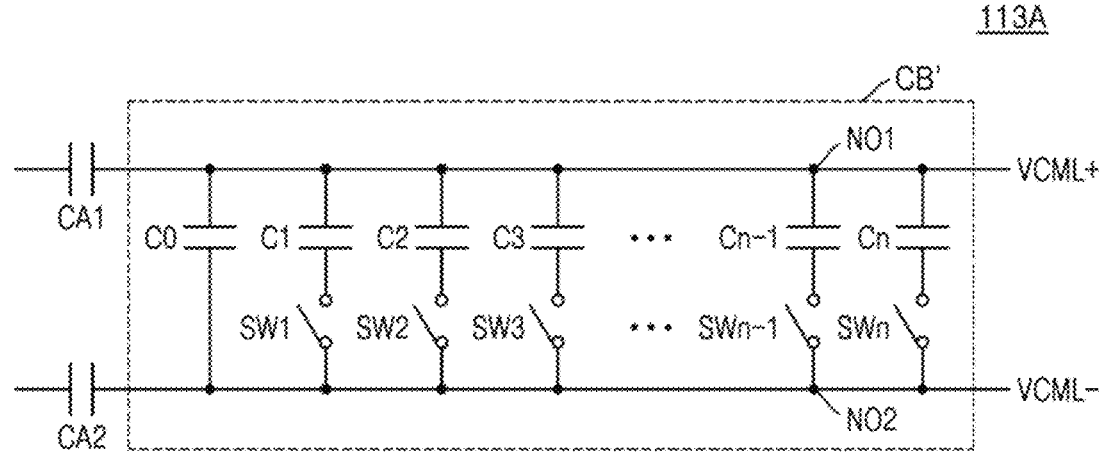
FIG. 6 is a circuit diagram of a swing width control circuit in the CMOS-to-CML converter according to an embodiment.

FIG. 5 is a circuit diagram of a CMOS-to-CML converter 11A which may be included in the semiconductor device 10 according to an embodiment. FIG. 6 is a circuit diagram of a swing width control circuit 113A included in the CMOS-to-CML converter 11A according to an embodiment.

Referring to FIG. 5, the CMOS-to-CML converter 11A may receive and convert CMOS input signals VCMOS+ and VCMOS−, which are differential signals, and may output CML output signals VCML+ and VCML−, which are differential signals. The CML output signals VCML+ and VCML− may be defined as a difference between the CMOS input signals VCMOS+ and VCMOS−. The CMOS-to-CML converter 11A may include a low-pass filter 111A and a swing width control circuit 113A.

The low-pass filter 111A may include an RC filter including a first resistor RA, a second resistor RB, and a capacitor C. In an embodiment, the resistance of the first resistor RA and the second resistor RB may be equal to each other, but embodiments are not limited thereto.

The swing width control circuit 113A may receive internal signals output from the low-pass filter 111A and generate the CML output signals VCML+ and VCML− by adjusting the swing widths of the internal signals. The internal signals may also include differential signals. The swing width control circuit 113A may include a first fixed capacitor CA1, a second fixed capacitor CA2, and a variable capacitor CB'. In an embodiment, the capacitance of the first fixed capacitor CA1 and the second fixed capacitor CA2 may be equal to each other, but embodiments are not limited thereto.

Referring to FIGS. 5 and 6, the swing width control circuit 113A may include the variable capacitor CB'. Here, the variable capacitor CB' may include a plurality of capacitors included in a capacitor array, for example first to n-th capacitors C0 to Cn (where n is a natural number), and a plurality of switches, for example first to n-th switches SW1 to SWn.

Each of the first to n-th capacitors C1 to Cn may be connected to a corresponding switch among the first to n-th switches SW1 to SWn. Based on the on/off state of the first to n-th switches SW1 to SWn, each of the first to n-th capacitors C1 to Cn may be connected to a first output node NO1 and a second output node NO2 and may be connected in parallel to a connection capacitor C0. The CML output signals VCML+ and VCML−, which are differential signals, may be output according to the voltage difference between the first output node NO1 and the second output node NO2. The magnitudes of the CML output signals VCML+ and VCML− may be controlled by an n-bit switching control signal for controlling each of the first to n-th switches SW1 to SWn.

In an embodiment, each of the first to n-th capacitors C1 to Cn may have the same capacitance. Also, in an embodiment, the capacitances of one or more of the first to n-th capacitors C1 to Cn may be different from each other. The capacitance of the first to n-th capacitors C1 to Cn may be freely modified. As the number of capacitors connected in parallel to the connection capacitor C0 from among the first to n-th capacitors C1 to Cn increases, the capacitance of the variable capacitor CB' may increase. Accordingly, the magnitudes of the CML output signals VCML+ and VCML− may decrease and the swing width may also decrease.

Figure 7:
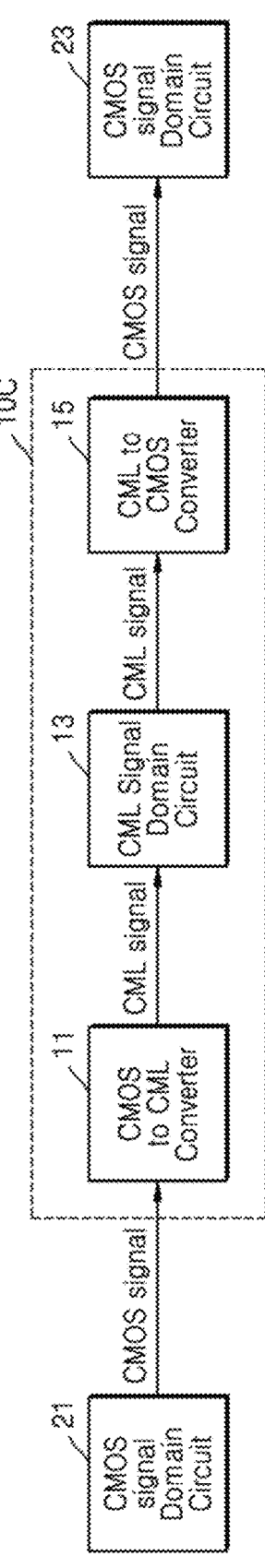
FIG. 7 is a block diagram for illustrating a semiconductor device according to an embodiment.
Figure 8:
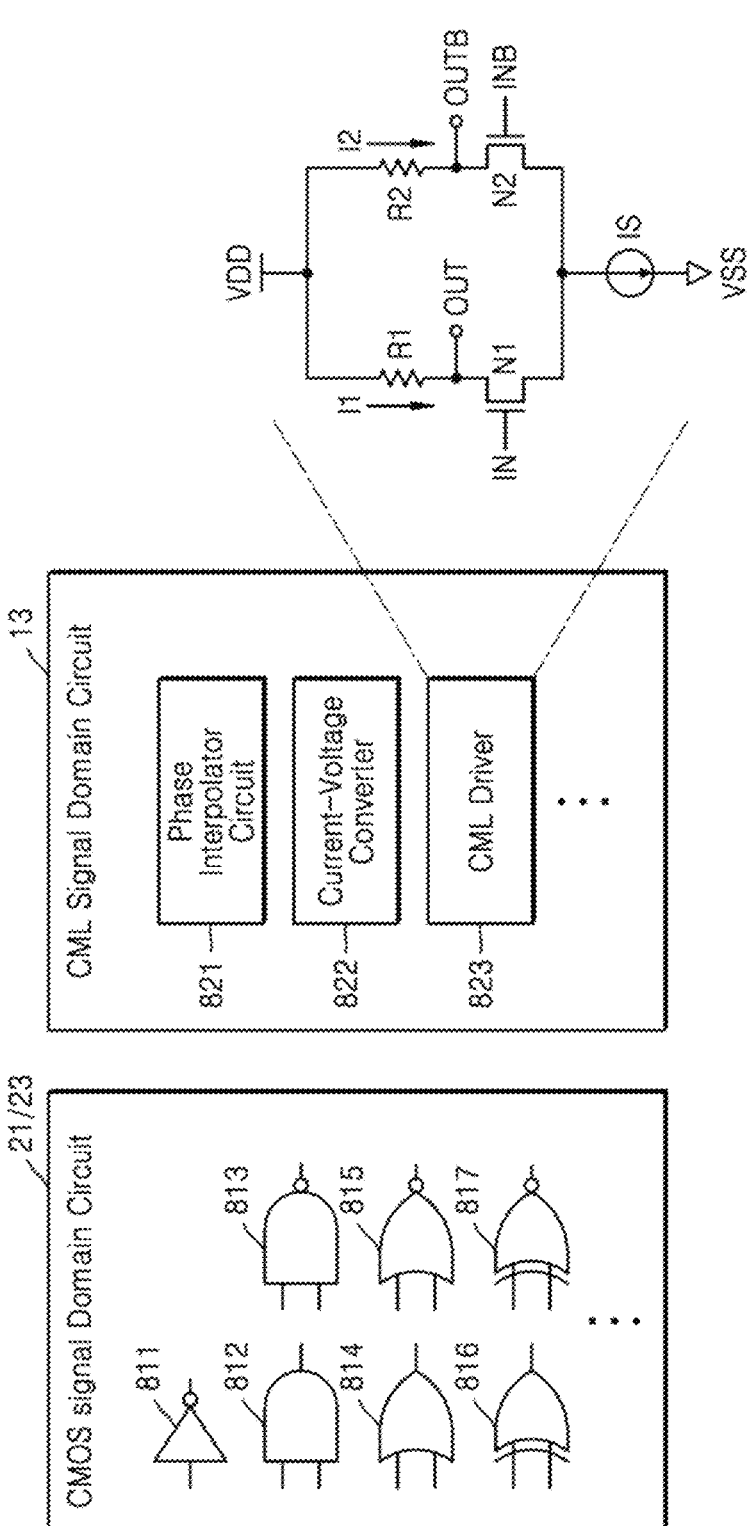
FIG. 8 is a diagram for illustrating a CMOS signal domain circuit and a CML signal domain circuit.

FIG. 7 is a block diagram for illustrating a semiconductor device 10C according to an embodiment. FIG. 8 is a diagram for illustrating a CMOS signal domain circuit and a CML signal domain circuit. The semiconductor device 10C and first and second CMOS signal domain circuits 21 and 23 shown in FIG. 7 may be provided in the electronic device 100 illustrated in FIG. 1.

Referring to FIG. 7, the semiconductor device 10C may receive a CMOS signal from the first CMOS signal domain circuit 21, and may transmit the CMOS signal to a second CMOS signal domain circuit 23. The first CMOS signal domain circuit 21 and the second CMOS signal domain circuit 23 may be provided in the same semiconductor device and may include, for example, a processor.

The semiconductor device 10C may include a CMOS-to-CML converter 11, a CML signal domain circuit 13, and a CML-to-CMOS converter 15. The CMOS-to-CML converter 11 and the CML-to-CMOS converter 15 may be provided in an interface circuit (e.g., the interface circuit I/F of FIG. 1) through which the semiconductor device 10C may communicate with the first CMOS signal domain circuit 21 and the second CMOS signal domain circuit 23. The CMOS-to-CML converter 11 may be correspond to at least one of the CMOS-to-CML converter 11 of FIG. 2 and the CMOS-to-CML converter 11A of FIG. 5.

The CMOS-to-CML converter 11 may convert a CMOS signal into a CML signal, and the CML signal domain circuit 13 may operate using the CML signal output from the CMOS-to-CML converter 11. In order to optimize the characteristics (e.g., process, voltage, and temperature (PVT) conditions, circuit structures, etc.) of the CML signal domain circuit 13, the capacitance of the variable capacitor (e.g., the variable capacitor CB of FIG. 2 or the variable capacitor CB' of FIG. 5) of the swing width control circuit (e.g., the swing width control circuit 113 of FIG. 2 or the swing width control circuit 113A of FIG. 5) in the CMOS-to-CML converter 11 may be determined, and the characteristics, such as the swing width and slew rate of the CML signal output from the CMOS-to-CML converter 11, may be determined.

The CML-to-CMOS converter 15 may receive the CML signal output as a result of the operation of the CML signal domain circuit 13 and may convert the received CML signal into a CMOS signal. The CML-to-CMOS converter 15 may convert the CML signal into the CMOS signal in a form suitable for transmission to the second CMOS signal domain circuit 23.

The CML signal may have a swing width which may be relatively less than a swing width of the CMOS signal. Therefore, the CML signal may be relatively difficult to use in a device in which a logic level of data is determined based on a voltage level. For example, it may be difficult to use the CML signal as a data signal, and thus, the CMOS signal having a relatively large swing width may be used in a device for inputting/outputting the data signal.

Referring to FIGS. 7 and 8, at least one of the first and second CMOS signal domain circuits 21 and 23 may operate using the CMOS signal and may include a digital circuit and logic circuits. For example, the CMOS signal domain circuit may include at least one of an inverter 811, an AND gate 812, a NAND gate 813, an OR gate 814, a NOR gate 815, an XOR gate 816, an XNOR gate 817, etc.

The CML signal domain circuit may operate using the CML signal and may include an analog circuit. For example, the CML signal domain circuit may include at least one of a phase interpolator circuit 821, a current-to-voltage converter 822, a CML driver 823, etc.

The phase interpolator circuit 821 may receive a plurality of clock signals and perform a phase interpolation operation using the plurality of clock signals, thereby generating clock signals with various interpolated phases. For example, a clock and data recovery (CDR) circuit may generate a clock signal that matches the data signal, so that the data signal received through an analog front end (AFE) as a receiver circuit in the semiconductor device 10C is captured at a correct position. The CDR circuit may generate clock signals using the phase interpolator circuit.

The CML driver 823 may include a circuit for generating a CML signal that swings at a CML level. For example, the CML driver 823 may include a first N-type transistor N1, a second N-type transistor N2, a first resistor R1, a second resistor R2, and a current source IS. A first input signal IN may be applied to a gate of the first N-type transistor N1, and the amount of a first current I1 flowing through the first N-type transistor N1 may be adjusted according to the first input signal IN. A second input signal INB may be applied to a gate of the second N-type transistor N2, and the amount of a second current I2 flowing through the second N-type transistor N2 may be adjusted according to the second input signal INB. The first input signal IN and the second input signal INB may have phases opposite to each other.

As an example, based on the voltage level of the first input signal IN rising to turn on the first N-type transistor N1, the voltage level of the second input signal INB may fall to turn off the second N-type transistor N2. Accordingly, the first current I1 may continuously flow, but the second current I2 may not flow. As a result, the voltage level of an output signal swinging at the CML level output through a second output node OUTB may be lowered, but the voltage level of a first output signal swinging at the CML level output through a first output node OUT may increase.

As another example, based on the voltage level of the first input signal IN falling to turn off the first N-type transistor N1, the voltage level of the second input signal INB may rise to turn on the second N-type transistor N2. Accordingly, the first current I1 may not flow, but the second current I2 may continuously flow. As a result, the voltage level of the output signal swinging at the CML level output through the second output node OUTB may increase, but the voltage level of an output signal swinging at the CML level output through the first output node OUT may be lowered.

Figure 9:
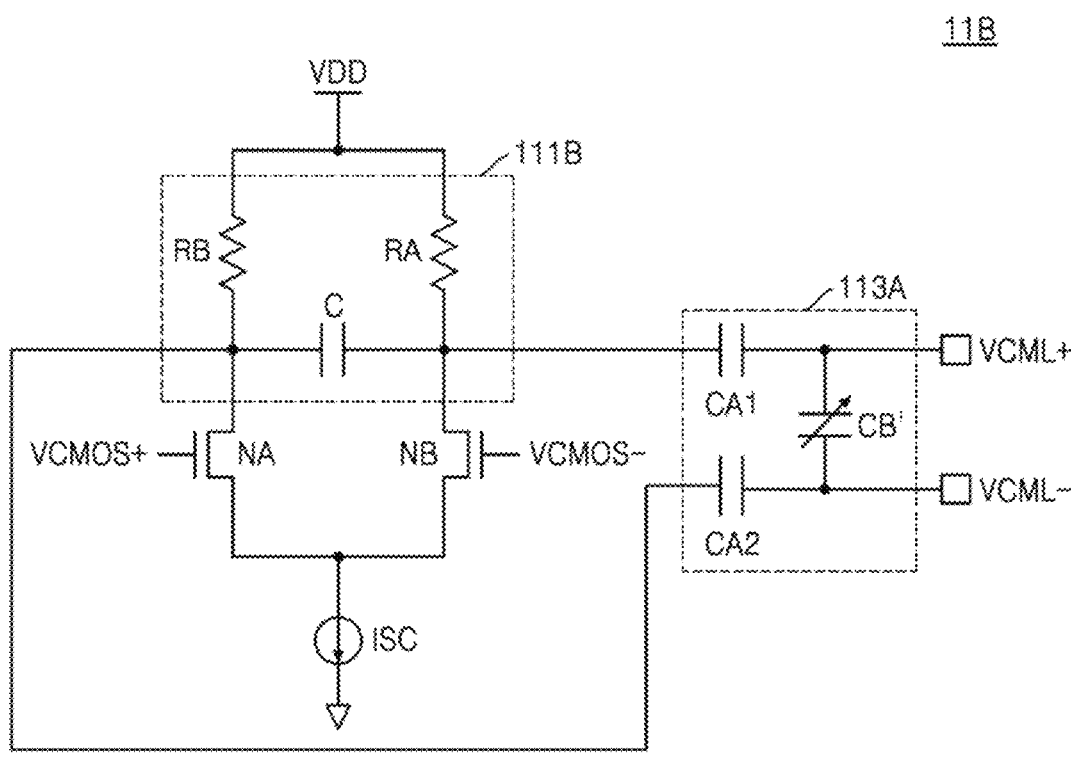
FIG. 9 is a circuit diagram of a CMOS-to-CML converter in the semiconductor device according to an embodiment.

FIG. 9 is a circuit diagram of a CMOS-to-CML converter 11B which may be included in the semiconductor device 10 according to an embodiment.

Referring to FIG. 9, the CMOS-to-CML converter 11B may receive and convert CMOS input signals VCMOS+ and VCMOS−, which are differential signals, and may output CML output signals VCML+ and VCML−, which are differential signals. The CMOS-to-CML converter 11B may have a circuit structure in which a CMOS-to-CML converter (e.g., the CMOS-to-CML converter 11A of FIG. 5) is combined with a CML driver (e.g., the CML driver 823 of FIG. 8).

The CMOS-to-CML converter 11B may include a low-pass filter 111B and a swing width control circuit 113A, and may further include a first N-type transistor NA, a second N-type transistor NB, and a current source ISC. The first CMOS input signal VCMOS+ may be applied to a gate of the first N-type transistor NA, and the second CMOS input signal VCMOS− may be applied to a gate of the second N-type transistor NB.

The low-pass filter 111B may include an RC filter including a first resistor RA, a second resistor RB, and a capacitor C. In an embodiment, the resistance of the first resistor RA and the second resistor RB may be equal to each other, but embodiments are not limited thereto.

The swing width control circuit 113A may receive internal signals output from the low-pass filter 111A and generate the CML output signals VCML+ and VCML− by adjusting the swing widths of the internal signals. The swing width control circuit 113A may include a first fixed capacitor CA1, a second fixed capacitor CA2, and a variable capacitor CB'. In an embodiment, the capacitance of the first fixed capacitor CA1 and the second fixed capacitor CA2 may be equal to each other, but embodiments are not limited thereto. Here, as described in FIG. 6, the variable capacitor CB' may include first to n-th capacitors C0 to Cn (where n is a natural number) included in a capacitor array, and first to n-th switches SW1 to SWn.

Figure 10:
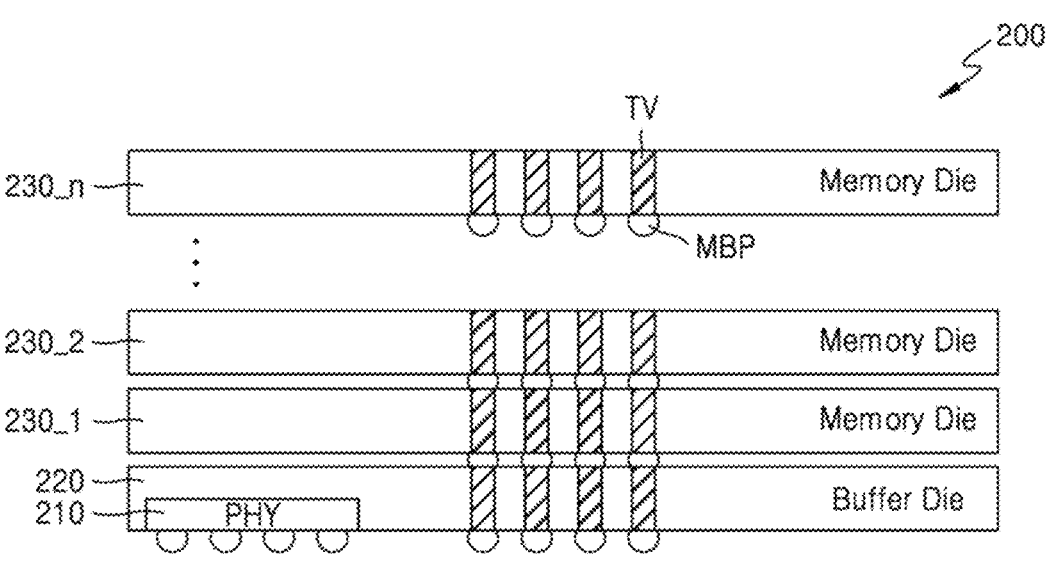
FIG. 10 is a cross-sectional view for illustrating a memory device, which is a semiconductor device in an electronic device according to an embodiment.

FIG. 10 is a cross-sectional view for illustrating a memory device 200, which is a semiconductor device in an electronic device according to an embodiment.

Referring to FIG. 10, the memory device 200 may include a three-dimensional stacked memory device. The memory device 200 may include a buffer die 220 and a plurality of memory dies stacked on the buffer die 220, for example, first to n-th memory dies 230_1 to 230_n. n may be a natural number of 3 or more, for example, n may be 4 or 8, and may be modified in various ways. The buffer die 220 and the first to n-th memory dies 230_1 to 230_n may be configured as a single semiconductor package.

The memory device 200 may include through-vias TV that pass through the buffer die 220 and the first to n-th memory dies 230_1 to 230_n and micro bumps MBP that electrically connect the through-vias TV to each other. The through-vias TV and the micro bumps MBP may provide electrical paths between the buffer die 220 and the first to n-th memory dies 230_1 to 230_n in the memory device 200. The numbers of through-vias TV and micro bumps MBP are not limited to those shown in FIG. 10 and may be varied in various ways. The n-th memory die 230_n may not have the through-vias TV, but the embodiment is not particularly limited thereto.

Each of the first to n-th memory dies 230_1 to 230_n may include a dynamic random access memory (DRAM) chip. For example, each of the first to n-th memory dies 230_1 to 230_n may include general-purpose DRAM devices, such as double data rate synchronous dynamic random access memory (DDR SDRAM), DRAM devices for mobile use, such as low power double data rate (LPDDR) SDRAM, DRAM devices for graphics, such as graphics double data rate (GDDR) and synchronous graphics random access memory (SGRAM), or DRAM devices for providing a high capacity and a high bandwidth, such as Wide input/output (I/O), high bandwidth memory (HBM), HBM2, HBM3, and hybrid memory cube (HMC). However, embodiments are not limited thereto, and each of the first to n-th memory dies 230_1 to 230_n may include a volatile memory device other than DRAM, or may include a non-volatile memory device.

According to an embodiment, the first to n-th memory dies 230_1 to 230_n may have substantially the same chip size. For example, the first to n-th memory dies 230_1 to 230_n may have substantially the same planar shape and planar size.

The buffer die 220 may provide data input/output signals, commands, addresses, and chip selection signals, which are received from a memory controller, to the first to n-th memory dies 230_1 to 230_n, or may perform an interface operation to provide data input/output signals, which are received from the first to n-th memory dies 230_1 to 230_n, to the memory controller. In order to perform this interface operation, the buffer die 220 may include a physical layer (PHY) 210 that includes an interface circuit. The PHY 210 may correspond to the interface circuit I/F of FIG. 1. The PHY 210 may include, for example, at least one of the CMOS-to-CML converter 11 of FIG. 2, the CMOS-to-CML converter 11A of FIG. 5, and the CMOS-to-CML converter 11B of FIG. 9.

Figure 11:
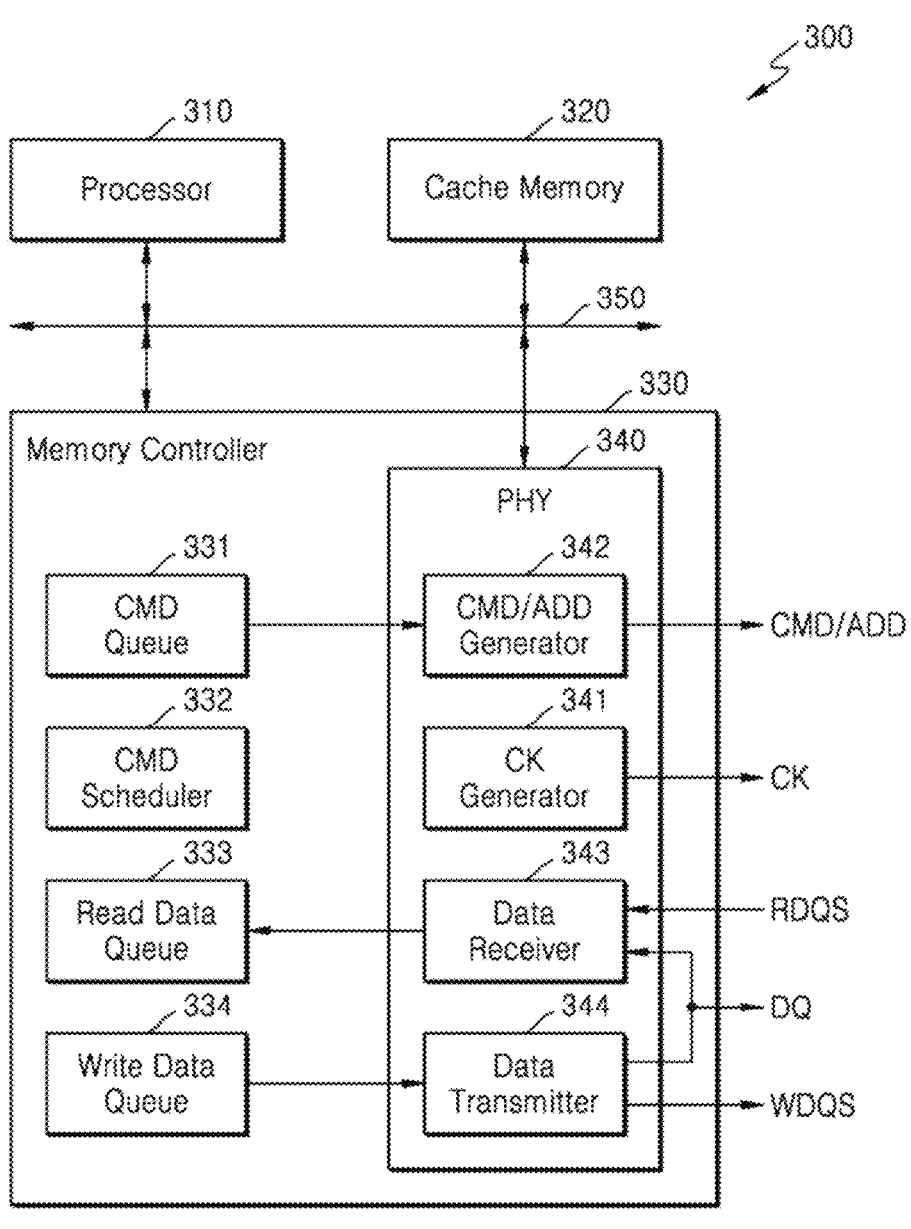
FIG. 11 is a block diagram for illustrating a system on chip (SoC) in an electronic device according to an embodiment.

FIG. 11 is a block diagram for illustrating a system on chip (SoC) 300 in an electronic device according to an embodiment.

Referring to FIG. 11, the SoC 300 may include a processor 310, a cache memory 320, a memory controller 330, and a bus 350. The bus 350 may provide a communication path between the processor 310, the cache memory 320, and the memory controller 330. The processor 310 may execute various software (application programs, operating systems, file systems, device drivers, etc.) loaded in the cache memory 320.

In an embodiment, the SoC 300 may be mounted on an interposer together with the memory device 200 of FIG. 10, and a PHY 340 of the SoC 300 and the PHY 210 of the memory device 200 may be connected to each other via an interposer. Also, in an embodiment, the memory device 200 may be disposed on the SoC 300.

The processor 310 may include a homogeneous multi-core or a heterogeneous multi-core. For example, the processor 310 may include any one of a CPU, an image signal processing (ISP) unit, a DSP unit, a GPU, a vision processing unit (VPU), and a neural processing unit (NPU). Also, the number of processors 310 may be one or more.

Application programs, operating systems, file systems, device drivers, or the like for driving electronic devices may be loaded on the cache memory 320. For example, the cache memory 320 may include a static random access memory (SRAM) device having a data input/output speed faster than that of the memory device 200.

The memory controller 330 may access the memory device 200 through a direct memory access (DMA) method. The memory controller 330 may include a command queue 331, a command scheduler 332, a read data queue 333, a write data queue 334, and a PHY 340. The PHY 340 may correspond to the interface circuit I/F of FIG. 1. The PHY 340 may include, for example, at least one of the CMOS-to-CML converter 11 of FIG. 2, the CMOS-to-CML converter 11A of FIG. 5, and the CMOS-to-CML converter 11B of FIG. 9. The above-described components 331 to 334 and 340 of the memory controller 330 may be provided in the SoC 300 by using a hardware method, a software method, or a combination thereof.

The command queue 331 may store commands and addresses issued by the processor 310 or generated under the control of the processor 310. The commands and addresses stored in the command queue 331 may be provided to the PHY 340 based on the control of the command scheduler 332.

The command scheduler 332 may adjust the sequence of the commands and addresses stored in the command queue 331, the time points at which the commands and addresses are input into the command queue 331, the time points at which the commands and addresses are output from the command queue 331, or the like.

The read data queue 333 may store read data transmitted from the memory device 200 via the PHY 340 by a read command. The read data stored in the read data queue 333 may be provided to the cache memory 320 and processed by the processor 310.

The write data queue 334 may store write data to be stored in the memory device 200. The write data stored in the write data queue 334 may be transmitted to the memory device 200 via the PHY 340 by a write command.

The PHY 340 may include a clock generator 341, a command/address generator 342, a data receiver 343, and a data transmitter 344. The clock generator 341 may generate a clock signal CK output to the memory device 200, and the number of clock signals CK may correspond to the number of channels between the SoC 300 and the memory device 200.

The command/address generator 342 may receive a command or address from the command queue 331 and transmit the command CMD or address ADD to the memory device 200. The data receiver 343 may receive read data of a data input/output signal DQ from the memory device 200 based on a read data strobe signal RDQS (or DQS). The data receiver 343 may provide the received read data to the read data queue 333. The data transmitter 344 may receive the write data from the write data queue 334. The data transmitter 344 may transmit the received write data to the memory device 200 based on a write data strobe signal WDQS (or DQS).

FIG. 12 is a diagram illustrating a system 1000 to which the semiconductor device according to an embodiment may be applied.

Referring to FIG. 12, the system 1000 of FIG. 12 may basically include mobile systems, such as a portable mobile phone, a smart phone, a tablet PC, a wearable device, a healthcare device, or an internet of things (IoT) device. However, the system 1000 of FIG. 12 is not limited to the mobile systems described above, and may include a personal computer, a laptop, a server, a media player, an automotive device such as a navigation unit, or the like.

Referring to FIG. 12, the system 1000 may include a main processor 1100, memory 1200*a* and 1200*b*, and storage devices 1300*a* and 1300*b*, and may further include one or more of an image capturing device 1410, a user input device 1420, a sensor 1430, a communication device 1440, a display 1450, a speaker 1460, a power supplying device 1470, and a connecting interface 1480.

The main processor 1100 may control the overall operation of the system 1000, and more specifically, the operation of all other components that are included the system 1000. This main processor 1100 may be provided as a general-purpose processor, a dedicated processor, or an application processor.

The main processor 1100 may include one or more CPU cores 1110 and may further include a controller 1120 for controlling the memory 1200*a* and 1200*b* and/or the storage devices 1300*a* and 1300*b*. According to an embodiment, the main processor 1100 may further include an accelerator block 1130, which includes a dedicated circuit for high-speed data computation, such as artificial intelligence data computation. The accelerator block 1130 may include a GPU, an NPU, and/or a data processing unit (DPU) and may be provided as a separate chip physically independent from other components of the main processor 1100.

The memory 1200*a* and 1200*b* may be used as main memory devices of the system 1000 and include volatile memory, such as SRAM and/or DRAM. However, the memory 1200*a* and 1200*b* may also include non-volatile memory, such as flash memory, phase-change random access memory (PRAM), and/or resistive random access memory (RRAM). The memory 1200*a* and 1200*b* may also be provided in the same package as the main processor 1100.

The storage devices 1300*a* and 1300*b* may function as non-volatile storage devices for storing data regardless of whether power is supplied and may have storage capacities relatively greater than those of the memory 1200*a* and 1200*b*. The storage devices 1300*a* and 1300*b* may respectively include storage controllers 1310*a* and 1310*b* and non-volatile memory (NVM) 1320*a* and 1320*b* that store data under the control of the storage controllers 1310*a* and 1310*b*. The NVM 1320*a* and 1320*b* may include negative-AND (NAND) flash memory, but may also include other types of non-volatile memory, such as PRAM and/or RRAM.

The storage devices 1300*a* and 1300*b* may be included in the system 1000 while being physically separated from the main processor 1100, or may be provided in the same package as the main processor 1100. In addition, the storage devices 1300*a* and 1300*b* have a form such as a solid state device (SSD) or a memory card and may be thus detachably coupled to other components of the system 1000 via an interface, such as the connecting interface 1480 described below. The storage devices 1300*a* and 1300*b* may include devices to which standard protocols such as universal flash storage (UFS) are applied.

The image capturing device 1410 may capture still images or moving images and may include a camera, a camcorder, and/or a webcam.

The user input device 1420 may receive various types of data input from a user of the system 1000 and may include a touch pad, a keypad, a keyboard, a mouse, and/or a microphone.

The sensor 1430 may detect various types of physical quantities obtained from outside the system 1000 and convert the sensed physical quantities into electric signals. This sensor 1430 may include a temperature sensor, a pressure sensor, an illuminance sensor, a position sensor, an acceleration sensor, a biosensor, and/or a gyroscope.

The communication device 1440 may transmit signals to and receive signals from other devices outside the system 1000 according to various communication protocols. This communication device 1440 may include an antenna, a transceiver, and/or a modem.

The display 1450 and the speaker 1460 may function as output devices that output visual information and auditory information, respectively, to a user of the system 1000.

The power supplying device 1470 may appropriately convert power supplied from a battery built in the system 1000 and/or an external power source and may supply the converted power to each of the components of the system 1000.

The connecting interface 1480 may provide connection between the system 1000 and an external device which is connected to the system 1000 to exchange data with the system 1000. The connecting interface 1480 may be provided in various interface methods, such as an advanced technology attachment (ATA), a serial ATA (SATA), an external SATA (e-SATA), a small computer small interface (SCSI), a serial attached SCSI (SAS), a peripheral component interconnection (PCI), a PCI express (PCIe), an NVM express (NVMe), IEEE 1394, a universal serial bus (USB), a secure digital (SD) card, a multi-media card (MMC), an embedded multi-media card (eMMC), a universal flash storage (UFS), an embedded universal flash storage (eUFS), and a compact flash (CF) card. The connecting interface 1480 may correspond to the interface circuit I/F of FIG. 1. The connecting interface 1480 may include, for example, at least one of the CMOS-to-CML converter 11 of FIG. 2, the CMOS-to-CML converter 11A of FIG. 5, and the CMOS-to-CML converter 11B of FIG. 9.

Figure 13:
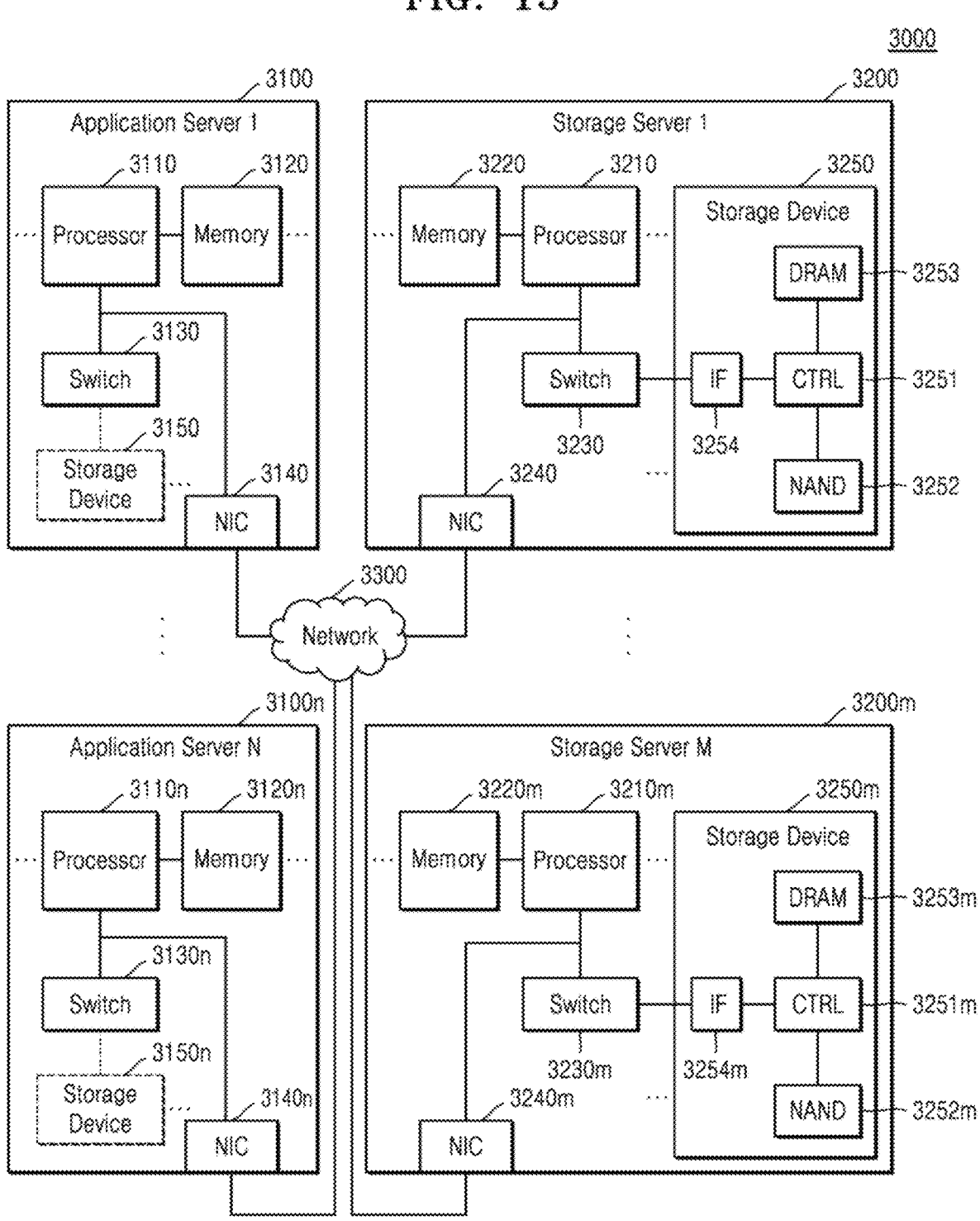
FIG. 13 is a diagram illustrating a data center to which the semiconductor device according to an embodiment may be applied.

FIG. 13 is a diagram illustrating a data center 3000 to which the semiconductor device according to an embodiment may be applied.

Referring to FIG. 13, the data center 3000 may include equipment for collecting various types of data and providing services and may also be referred to as a data storage center. The data center 3000 may include systems for operating search engines and databases and may include computing systems used in companies, such as banks or government agencies. The data center 3000 may include application servers 3100 to 3100*n* and storage servers 3200 to 3200*m*. The number of application servers 3100 to 3100*n* and the number of storage servers 3200 to 3200*m* may be selected in various ways depending on embodiments, and the number of application servers 3100 to 3100n and the number of storage servers 3200 to 3200m may be different from each other.

The application server 3100 or the storage server 3200 may include at least one of processors 3110 and 3210 and memory 3120 and 3220. In an embodiment, the processor 3210 may control the overall operation of the storage server 3200 and may access the memory 3220 to execute commands and/or data loaded into the memory 3220. The memory 3220 may include DDR SDRAM, HBM, HMC, a dual in-line memory module (DIMM), an Optane DIMM, or a non-volatile DIMM (NVMDIMM). According to an embodiment, the number of processors 3210 and the number of memory 3220 in the storage server 3200 may be selected in various ways. In an embodiment, the processor 3210 and the memory 3220 may provide a processor-memory pair. In an embodiment, the number of processors 3210 and the number of memory 3220 may be different from each other. The processor 3210 may include a single core processor or a multi core processor. The above description of the storage server 3200 may be similarly given to the application server 3100. According to an embodiment, the application server 3100 may not include a storage device 3150. The storage server 3200 may include at least one storage device 3250. The number of storage devices 3250 in the storage server 3200 may be selected in various ways depending on embodiments.

In an embodiment, an interface 3254 may provide a physical connection between the processor 3210 and a controller 3251 and a physical connection between a network interface card (NIC) 3240 and the controller 3251. For example, the interface 3254 may be provided in a direct attached storage method and establish a direct connection to the storage device 3250 with a dedicated cable. Also, for example, the interface 3254 may be provided in various interface methods, such as an ATA, a SATA, an e-SATA, an SCSI, an SAS, a PCI, a PCIe, an NVMe, IEEE 1394, a USB, an SD card, an MMC, an eMMC, a UFS, an eUFS, and a CF card. The interface 3254 may correspond to the interface circuit I/F of FIG. 1. The interface 3254 may include, for example, at least one of the CMOS-to-CML converter 11 of FIG. 2, the CMOS-to-CML converter 11A of FIG. 5, and the CMOS-to-CML converter 11B of FIG. 9.

The storage server 3200 may further include a switch 3230 and the NIC 3240. The switch 3230 may selectively connect the processor 3210 to the storage device 3250 or the NIC 3240 to the storage device 3250 under the control of the processor 3210.

In an embodiment, the NIC 3240 may include a network interface card, a network adapter, etc. The NIC 3240 may be connected to a network 3300 via a wired interface, a wireless interface, a Bluetooth interface, an optical interface, etc. The NIC 3240 may include internal memory, a DSP, a host bus interface, or the like and may be connected to the processor 3210 and/or the switch 3230 via the host bus interface. The host bus interface may be provided as one of the examples of the interface 3254 described above. In an embodiment, the NIC 3240 may be integrated with at least one of the processor 3210, the switch 3230, and the storage device 3250.

While some embodiments have been particularly shown and described above, it will be understood that various changes in form and details may be made therein without departing from the spirit and scope of the following claims.

What is claimed is:

1. A complementary metal oxide semiconductor (CMOS)-to-current mode logic (CML) converter for converting a CMOS input signal into a CML output signal, the CMOS-to-CML converter comprising:

a low-pass filter comprising a fixed resistor and a first fixed capacitor; and a swing width control circuit configured to adjust a swing width of a voltage swing of the CML output signal based on a common mode level, wherein the swing width control circuit comprises:

a second fixed capacitor; and a variable capacitor comprising a capacitor array.

2. The CMOS-to-CML converter of claim 1, wherein the capacitor array comprises:

a connection capacitor connected between a ground voltage and an output node, wherein the CML output signal is output through the output node; and a plurality of capacitors, wherein a first end of each capacitor of the plurality of capacitors is connected to the output node, wherein the variable capacitor further comprises a plurality of switches corresponding to the plurality of capacitors, and wherein each switch from among the plurality of switches connects a second end of a corresponding capacitor from among the plurality of capacitors to the ground voltage.

3. The CMOS-to-CML converter of claim 2, wherein capacitances of the plurality of capacitors increase sequentially according to a geometric sequence with a common ratio of two.

4. The CMOS-to-CML converter of claim 1, wherein the CMOS input signal and the CML output signal comprise differential signals, wherein the capacitor array comprises:

a connection capacitor connected to a first output node and a second output node, through which the CML output signal is output; and a plurality of capacitors, wherein a first end of each capacitor of the plurality of capacitors is connected to the first output node, and wherein the variable capacitor further comprises a plurality of switches, wherein each switch from among the plurality of switches connects a second end of a corresponding capacitor from among the plurality of capacitors to the second output node.

5. The CMOS-to-CML converter of claim 1, wherein the swing width changes based on a change in a capacitance of the variable capacitor, and wherein a time point at which the CML output signal reaches the common mode level does not change based on the change in the capacitance of the variable capacitor.

6. The CMOS-to-CML converter of claim 1, wherein a capacitance of the variable capacitor changes based on characteristics of a circuit configured to operate based on the CML output signal.

7. The CMOS-to-CML converter of claim 1, wherein the CMOS input signal has a square wave shape, and wherein the CML output signal has a triangle wave shape.

8. A semiconductor device comprising:

a complementary metal oxide semiconductor (CMOS)-to-current mode logic (CML) converter for converting a CMOS input signal into a CML output signal, wherein the CMOS-to-CML converter comprises:

a low-pass filter configured to generate an internal signal by attenuating components of the CMOS input signal; and a swing width control circuit configured to generate the CML output signal by adjusting a swing width of a voltage swing of the internal signal, and wherein the swing width control circuit comprises:

a fixed capacitor; and a variable capacitor comprising a capacitor array.

9. The semiconductor device of claim 8, wherein the capacitor array comprises:

a connection capacitor connected between a ground voltage and an output node, wherein the CML output signal is output through the output node; and a plurality of capacitors, wherein a first end of each capacitor of the plurality of capacitors is connected to the output node, wherein the variable capacitor further comprises a plurality of switches corresponding to the plurality of capacitors, and wherein each switch from among the plurality of switches connects a second end of a corresponding capacitor from among the plurality of capacitors to the ground voltage.

10. The semiconductor device of claim 8, wherein the CMOS input signal and the CML output signal comprise differential signals, and wherein the capacitor array comprises:

a connection capacitor connected to a first output node and a second output node, through which the CML output signal is output; and a plurality of capacitors, wherein a first end of each capacitor of the plurality of capacitors is connected to the first output node, and wherein the variable capacitor further comprises a plurality of switches, wherein each switch from among the plurality of switches connects a second end of a corresponding capacitor from among the plurality of capacitors to the second output node.

11. The semiconductor device of claim 8, further comprising a CML signal domain circuit configured to operate based on the CML output signal, wherein capacitance of the variable capacitor is determined based on characteristics of the CML signal domain circuit.

12. The semiconductor device of claim 11, wherein the semiconductor device is configured to change the capacitance of the variable capacitor based on an operation result of the CML signal domain circuit.

13. The semiconductor device of claim 11, wherein the CML signal domain circuit comprises a phase interpolator circuit.

14. The semiconductor device of claim 8, further comprising a CML-to-CMOS converter configured to convert a CML signal into a CMOS signal.

15. The semiconductor device of claim 8, wherein the swing width of a voltage swing of the CML output signal changes based on a change in a capacitance of the variable capacitor, and wherein a time point at which the CML output signal reaches a common mode level does not change based on the change in the capacitance of the variable capacitor.

16. The semiconductor device of claim 8, further comprising an interface circuit configured to communicate with an external device, wherein the interface circuit comprises the CMOS-to-CML converter.

17. An electronic device comprising:

a complementary metal oxide semiconductor (CMOS) signal domain circuit configured to operate based on a CMOS signal; and a semiconductor device comprising:

a current mode logic (CML) signal domain circuit configured to operate using a CML signal, and a CMOS-to-CML converter configured to convert a CMOS input signal into a CML output signal, wherein the CMOS-to-CML converter comprises:

a low-pass filter comprising a fixed resistor and a first fixed capacitor; and a swing width control circuit, and wherein the swing width control circuit comprises:

a second fixed capacitor, and a variable capacitor comprising a capacitor array.

18. The electronic device of claim 17, wherein the swing width control circuit is configured to adjust a swing width of a voltage swing of the CML output signal according to a ratio between a capacitance of the variable capacitor and a capacitance of the second fixed capacitor.

19. The electronic device of claim 17, wherein the capacitor array comprises:

a connection capacitor connected between a ground voltage and an output node through which the CML output signal is output; and a plurality of capacitors, wherein a first end of each capacitor of the plurality of capacitors is connected to the output node, wherein the variable capacitor further comprises a plurality of switches corresponding to the plurality of capacitors, and wherein each switch from among the plurality of switches connects a second end of a corresponding capacitor from among the plurality of capacitors to the ground voltage.

20. The electronic device of claim 17, wherein the CMOS input signal and the CML output signal comprise differential signals, and wherein the capacitor array comprises:

a connection capacitor connected to a first output node and a second output node, through which the CML output signal is output; and a plurality of capacitors, wherein a first end of each capacitor of the plurality of capacitors is connected to the first output node, wherein the variable capacitor further comprises a plurality of switches, wherein each switch from among the plurality of switches connects a second end of a corresponding capacitor from among the plurality of capacitors to the second output node.

* * * * *